(12) United States Patent
Bazzano et al.

(10) Patent No.: US 7,715,159 B2
(45) Date of Patent: May 11, 2010

(54) ESD PROTECTION CIRCUIT

(75) Inventors: Gaetano Bazzano, Floridia (IT); Giuseppe Consentino, Gravina Di Catania (IT); Antonio Grimaldi, S. Giovanni La Punta (IT); Monica Micciché, Enna (IT)

(73) Assignee: STMicroelectronics S.r.l., Agrate Brianza (mi) (IT)

( * ) Notice: Subject to any disclaimer, the term of this patent is extended or adjusted under 35 U.S.C. 154(b) by 198 days.

(21) Appl. No.: 11/775,897

(22) Filed: Jul. 11, 2007

(65) Prior Publication Data

US 2008/0013231 A1 Jan. 17, 2008

(30) Foreign Application Priority Data

Jul. 13, 2006 (EP) .................... 06117131

(51) Int. Cl.
*H02H 9/00* (2006.01)
(52) U.S. Cl. .................... 361/56; 361/91.1; 361/111
(58) Field of Classification Search .................... 361/56, 361/91.1, 111
See application file for complete search history.

(56) References Cited

U.S. PATENT DOCUMENTS

| | | | | |
|---|---|---|---|---|
| 4,890,003 | A * | 12/1989 | Seibert et al. | 307/66 |
| 5,134,088 | A * | 7/1992 | Zetterlund | 438/210 |
| 5,963,407 | A | 10/1999 | Fragapane et al. | |
| 5,986,861 | A | 11/1999 | Pontarollo | |
| 6,069,493 | A | 5/2000 | Pigott et al. | |
| 6,803,633 | B2 * | 10/2004 | Mergens et al. | 257/358 |
| 7,586,720 | B1 * | 9/2009 | Ozard | 361/56 |
| 2002/0153571 | A1 | 10/2002 | Mergens et al. | |
| 2003/0006829 | A1 * | 1/2003 | Alessandria et al. | 327/538 |
| 2004/0057172 | A1 * | 3/2004 | Sun | 361/56 |
| 2006/0209479 | A1 | 9/2006 | Grombach et al. | |

FOREIGN PATENT DOCUMENTS

EP 0768713 A2 4/1997

OTHER PUBLICATIONS

European Search Report from orresponding European Application No. 06117131, filed Jul. 13, 2006.

* cited by examiner

*Primary Examiner*—Jared J Fureman
*Assistant Examiner*—Terrence R Willoughby
(74) *Attorney, Agent, or Firm*—Lisa K. Jorgenson; James H. Morris; Wolf, Greenfield & Sacks, P.C.

(57) ABSTRACT

An electro-static discharge protection circuit including: a first input terminal and a second input terminal; a first output terminal coupled to the first input terminal, and a second output terminal coupled to the second input terminal; a first circuit branch connected between the first input terminal and the second input terminal, said first circuit branch including at least one first Zener diode having a cathode terminal and an anode terminal; a second circuit branch connected between the first output terminal and the second output terminal, wherein the first circuit branch comprises a load element coupled between the second input terminal and the anode terminal of the at least one first Zener diode; the second circuit branch includes a first transistor having a control terminal adapted to receive a transistor control voltage, the first transistor being coupled to the load element so as to receive from the load element the transistor control voltage.

22 Claims, 7 Drawing Sheets

ESD PROTECTION CIRCUIT

BACKGROUND OF THE INVENTION

1. Field of the Invention

The present invention relates to the field of electronic devices. More specifically, the present invention relates to circuits for protecting such electronic devices from Electro-Static Discharge ('ESD') events.

2. Discussion of the Related Art

Electronic devices, such as semiconductor devices of an Integrated Circuit ('IC'), need protection against undesired, potentially harmful events. Examples of these undesired events are electrostatic discharges, occurring when an electrostatic charge builds up on one of two electrically insulated elements, like the plates of a capacitor, so as to significantly increase the electrical potential difference between the two elements, until a conductive path from the first to the second insulated element is established, resulting in a sudden and undesired current, which may damage the semiconductor device, e.g. the capacitor dielectric.

Generally, electrostatic discharge takes place during handling of the integrated circuit. For example, damage occurs during the testing phase of the IC, or during its packaging or assembly onto a circuit board, and possibly during the operation of the electronic system of which the IC is part. Damages caused by ESD events can partially or totally hamper the functionality of the IC.

ESD events may, in particular, occur when a charged body (such as a person) touches the externally-accessible terminals of the IC. Each external terminal (which is used for accessing the IC from the outside) is connected, typically through a bonding wire, to a corresponding internal terminal of the IC. In such a way, the ESD event can involve one or more of the semiconductor devices of the IC. For example, a semiconductor device of the IC may be applied a voltage drop higher than a maximum voltage which it is able to sustain, and thus it may break.

In order to avoid damage caused ESD events, ICs comprise ESD protection circuits associated with the IC terminals. In particular, known ESD protection circuits are designed to provide, when necessary, a high conductivity path, adapted to safely sink the excessive electrostatic charge that builds up on the IC internal terminals from the semiconductor devices of the IC.

Examples of ESD protection circuits are well known in the art. An example of known ESD protection circuit, used in particular to protect semiconductor devices which are power device, such as power MOSFETs, adapted to sustain voltages ranging from, for example, 8V to 1500V, includes two circuit branches, arranged in a Π-shaped circuit structure; each branch includes two Zener diodes, which are connected in series and back to back. In case of an ESD event, either one of the two Zener diodes in each branch is reverse biased at the Zener voltage, whereas the other Zener diode is forward biased; the excessive electrostatic charge is thus safely sunk.

For better clarity, a conventional Π-shape ESD protection circuit 105 is schematically shown in FIG. 1. The ESD protection circuit 105 can be schematized as a quadrupole coupled to two IC terminals 106 and 107, in the example herein considered input terminals; for example, the terminal 107 is the IC terminal intended in operation to be connected to a reference voltage, like the ground, whereas the input terminal 106 is a terminal that, in operation, is intended to receive a drive (gate) voltage Vin (with respect to the ground voltage applied to the terminal 107) for a semiconductor device 110 which is assumed to be a power MOSFET. The ESD protection circuit 105 is further coupled to a first and second terminals 108 and 109 of the semiconductor device 110, in the example considered the gate and the source of the power MOSFET to be protected.

ESD events may cause the drive voltage Vin to take values that are much higher than the maximum value it is expected to take in operation, and may be either positive or negative.

In the drawing, the semiconductor device 110 is schematically represented by a capacitor Cgs, representative of the gate capacitance of the power MOSFET, between the power MOSFET gate terminal 108 and source terminal 109. The capacitor Cgs is designed so as to be able to sustain without breaking a voltage difference up to a breaking voltage Vbv (for example, ranging from 15V to 30V).

The protection circuit 105 includes a first circuit branch 111 with two Zener diodes D1 and D2, which are connected back to back (i.e., the diode D1 has a cathode terminal connected to a cathode terminal of the diode D2) in series between a first terminal 113 connected to the IC terminal 106 and a second terminal 114 connected to the IC terminal 107.

The protection circuit 105 has a second circuit branch 112 including two further back-to-back Zener diodes D3 and D4 connected in series between a first terminal 115 and a second terminal 116 of the second branch 112. A resistor R1 is connected between the first terminal 113 of the first circuit branch 111 and the first terminal 115 of the second circuit branch 112. The second terminal 116 of the second circuit branch 112 is connected to the IC terminal 107, so that the first and the second circuit branches 111 and 112 together with the resistor R1 have a Π shape.

In the example at issue, the Zener diodes D1 and D2 are designed so to have a first Zener (breakdown) voltage Vz1 lower in absolute value than the absolute value of the breaking voltage Vbv. In particular, the first Zener voltage Vz1 is lower than the breaking voltage Vbv of at least a predetermined voltage Vf, that corresponds to the diode threshold voltage for entering the forward-biasing condition (e.g., Vf ranges from 0.2V to 0.4V). The Zener diodes D3 and D4 are designed so to have a second Zener (breakdown) voltage Vz2. Typically, the second Zener (breakdown) voltage Vz2 is equal to the first Zener voltage Vz1.

In absence of the protection circuit 105, when, due to an ESD event, the value of the drive voltage Vin exceeds the breaking voltage Vbv (in particular, when the value of the drive voltage is approximately an order of magnitude higher than the breaking voltage Vbv, such as, from 2000V to 8000V according to the IEC 1000-4-2 specification relating to the ESD protection levels) a discharge current Ibv would flow through the capacitor Cgs, which would thus be damaged. In cases like this, the ESD protection circuit 105 activates to safely sink from the capacitor Cgs the discharge current Ibv, and limiting the voltage applied to the semiconductor device 110.

In fact, in such biasing condition, depending on the polarity (sign) of the drive voltage Vin, one between the Zener diodes D1 and D2 conducts a reverse current, being reverse biased at the first Zener voltage, whereas the other Zener diode is forward biased and thus conducts a forward current.

In particular, when the drive voltage Vin is positive (with the sign convention adopted in FIG. 1 i.e., the potential at the IC terminal 106 is higher than the potential at the IC terminal 107 of at least the first Zener voltage Vz1 plus the diode threshold voltage value Vf), the diode D1 is forward biased, whereas the diode D2 is reverse biased at the first Zener voltage Vz1. As a result, a first current I111 flows through the first circuit branch 111 from the first terminal 113 to the second terminal 114 thereof.

Concurrently, the diodes D3 and D4 conduct current, being the diode D3 forward biased and the diode D4 reverse biased, so that the second circuit branch 112 can conduct a second current I112, flowing through the second circuit branch 112 from the first terminal 115 to the second terminal 116 thereof.

Vice versa, when polarity of the drive voltage Vin is reversed (i.e., the IC terminal 106 is at a potential lower than the potential of the IC terminal 107 of at least the first Zener voltage Vz1 plus the diode threshold voltage, the diode D1 is reverse biased at the Zener voltage, whereas the diode D2 is forward biased. The first currents I111 flows in this case through the circuit branch 111 from the second terminal 114 to the first terminal 113 thereof. Similarly, the second current I112 flows through the second circuit branch 112 from the second terminal 116 to the first terminal 115 thereof.

In both cases, substantially no current flows through the semiconductor device 110. The ESD protection circuit thus avoids breaking of capacitor Cgs thus meaning that the gate oxide of the MOSFET is shielded from undesired breaking events.

During the normal operation (when no ESD events occur) the ESD protection circuit 105 is off: as long as the drive voltage Vin is lower than breaking voltage Vbv, the first circuit branch 111 and the second circuit branch 112 are not conductive, since the voltage drop applied thereto is not sufficient for turning on at least one Zener diode among the diodes D1-D4 in reverse biasing voltage operation. In this way, a non-destructive current (i.e., lower in absolute value than the discharge current Ibv) can flow through the semiconductor device 110 for driving it, without causing malfunctioning or damage thereof.

SUMMARY OF THE INVENTION

A drawback of the solution described above is that each Zener diode D1-D4 has a non-negligible intrinsic capacity, which slows down the intervention of the ESD protection circuit 105.

Moreover, in order to increase the conductivity of each branch (thereby making it easy to sink the electrostatic charge) the differential resistance of each Zener diode D1-D4 should be kept relatively low (such as lower than 100Ω). This has a detrimental impact on the size of the whole ESD protection circuit 105, since the differential resistance reduces with the increment of the size of the Zener diode and at the same time increases the leakage effects (such as leakage currents) so impairing the correct operation of the ESD protection circuit.

In general terms, the present invention is based on the idea of reducing the number of Zener diodes needed to realize the ESD protection circuit.

Particularly, the present invention provides a solution as set out in the independent claims.

An aspect of the present invention proposes an electrostatic discharge protection circuit. The electrostatic discharge circuit includes a first input terminal and a second input terminal; a first output terminal coupled to the first input terminal, and a second output terminal coupled to the second input terminal; a first circuit branch connected between the first input terminal and the second input terminal. The first circuit branch includes at least one first Zener diode having a cathode terminal and an anode terminal. The electrostatic discharge circuit includes a second circuit branch connected between the first output terminal and the second output terminal. The first circuit branch comprises a load element coupled between the second input terminal and the anode terminal of the at least one first Zener diode; the second circuit branch includes a first transistor having a control terminal adapted to receive a transistor control voltage, the first transistor being coupled to the load element so as to receive from the load element the control voltage.

DETAILED DESCRIPTION

Figure 1:
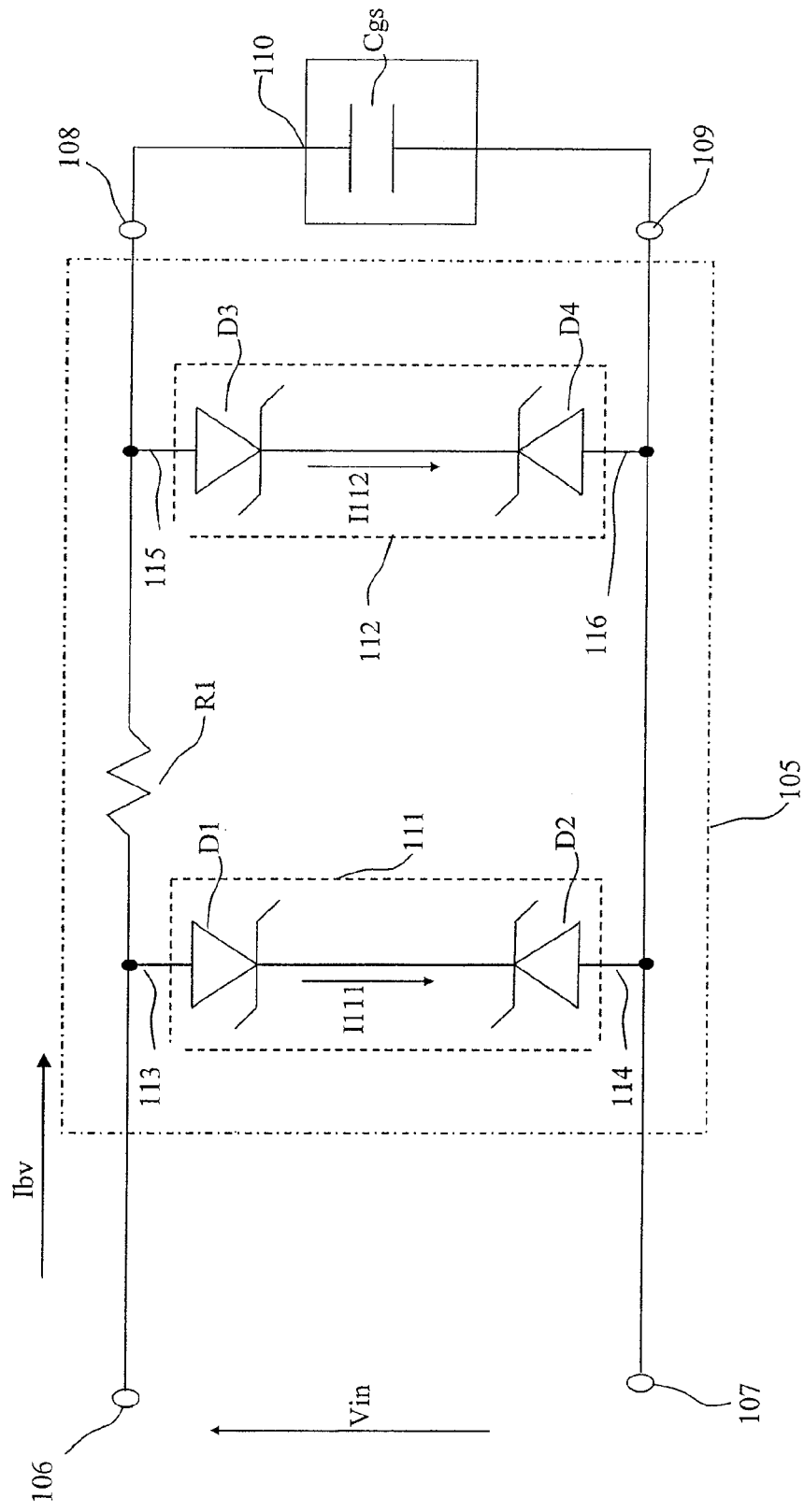
FIG. 1 is a schematic ESD protection circuit according to the prior art.
Figure 2:
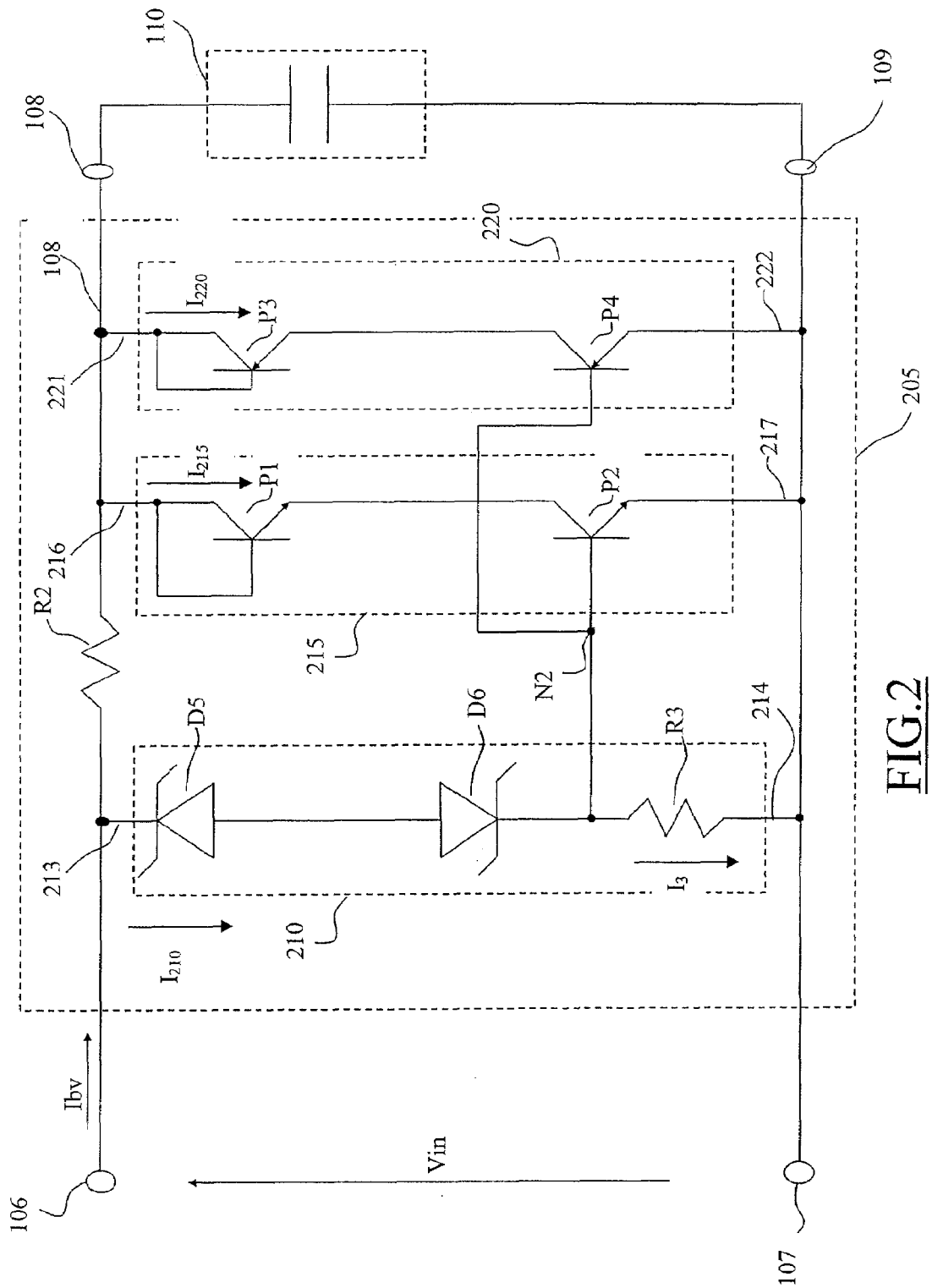
FIG. 2 schematically shows an ESD protection circuit according to an embodiment of the present invention.

Referring to FIG. 2, an ESD protection circuit 205 according to an embodiment of the present invention is schematically depicted. Elements identical or similar to those shown in FIG. 1 are denoted by the same reference numerals.

The ESD protection circuit 205 includes a first circuit branch 210 having a first terminal 213, which is connected to the IC terminal 106, and a second terminal 214 which is connected to the IC terminal 107. The first circuit branch 210 includes two series-connected Zener diodes D5 and D6 and a resistor R3. In particular, the diode D5 has a cathode terminal, which is connected to the first terminal 213, and an anode terminal, which is connected to an anode terminal of the diode D6. The resistor R3 has a first terminal, which is, connected to a cathode terminal of the diode D6 (denoted as node N2 in the drawing) and a second terminal, which is connected to the second terminal 214.

The ESD protection circuit 205 also includes a second circuit branch 215 having a first terminal 216 and a second terminal 217. The second circuit branch 215 includes two BJTs (acronym for Bipolar Junction Transistors) P1 and P2 of a first polarity (e.g., NPN-type) which are connected in series between the first and the second terminals 216 and 217. In detail, the transistor P1 has a collector terminal connected to the first terminal 216, and to a base terminal thereof, thereby the transistor P1 is connected as a "diode". An emitter terminal of the transistor P1 is connected to a collector terminal of the transistor P2, which has an emitter terminal connected to the second terminal 217 of the second circuit branch 215. A base terminal of the transistor P2 is connected the cathode terminal (node N2) of the diode D6.

A resistor R2 is connected between the first terminal 213 of the first circuit branch 210 and the first terminal 216 of the second circuit branch 215. The second terminal 217 of the second circuit branch 215 is connected to the second terminal 214 of the first circuit branch 210, and thus to the IC terminal 107.

The ESD protection circuit 205 further includes a third circuit branch 220 having a first and second terminals 221 and 222, respectively connected to the first terminal 216 and to the second terminal 217 of the second branch 215 (thus, the second terminal 222 of the third branch is connected to the IC terminal 107). The third branch 220 includes two further series-connected BJTs P3 and P4 of a second polarity (e.g., PNP-type). The transistor P3 has a collector terminal connected to the first node 221 of the third branch 220, and to a base terminal thereof, resulting connected as a "diode"; the emitter terminal of the transistor P3 is connected to the collector terminal of the transistor P4 which has an emitter terminal connected to the second terminal 222 of the third branch 220. A base terminal of the transistor P4 is connected to the node N2.

The second and third branches 215 and 220 are thus in parallel to the semiconductor device 110 (e.g., a power MOSFET) to be protected against ESD events.

In the example at issue, the Zener diodes D5 and D6 are designed so to have a third Zener (breakdown) voltage Vz3, lower in absolute value than the absolute value of the breaking voltage Vbv of the semiconductor device 110. In particular, the third Zener voltage Vz3 is lower than the breaking voltage Vbv of at least twice a threshold voltage Vf of the diode D5 and D6.

During an ESD event, the drive voltage Vin between the IC terminals 106 and 107 reaches (and, possibly, exceeds) the breaking voltage Vbv, meaning that the drive voltage Vin is higher than the maximum voltage (referred to as the 'absolute maximum rating' of the MOSFET) which is able to sustain the gate oxide of the MOSFET without to run into breaking events. When this occurs, the first circuit branch 210 forms a conductive path.

In particular, when the drive voltage Vin is positive (i.e., the potential at the IC terminal 106 is higher than the potential at the IC terminal 107) and equal at least to the third Zener voltage Vz3 plus twice the diode threshold voltage value Vf the diode D5 is reversed biased, and a voltage drop thereacross is essentially equal to the Zener voltage Vz3, whereas the diode D6 is forward biased (and a voltage drop across it is essentially equal to the threshold voltage Vf).

In such a way, a first current I210 flows through the first branch 210 from the first terminal 213 to the cathode terminal (node N2) of the Zener diode D6. A fraction 13 of the current I210 flows through the resistor R3, thereby developing across it a voltage drop sufficient to turn the transistor P2 on (when a base to emitter voltage of the transistor P2 reaches a voltage substantially equal to the threshold voltage Vf). Therefore, the transistor P2, and thus the second branch 215, conducts a current I215. In the example at issue, the transistor P2 has a current gain between a base current flowing through its base terminal and an emitter current flowing through its emitter terminal approximately equal to one. In this way, the current flowing through the base terminal of the transistor P2 is approximately equal to the current I215.

The third branch 220 is instead non-conductive. In fact, the transistor P4 is turned off since the voltage, which develops across the resistor R3 reversly biases the emitter-base junction of the transistor P4. The transistor P3 is off as well, since which is series-connected to the transistor P4.

The discharge current Ibv is partitioned in the currents I210 and I215 and it is safely sunk from the semiconductor device 110.

Vice versa, when the drive voltage Vin is negative (i.e., the potential at the IC terminal 106 is lower than the potential at the IC terminal 107) and equal (in absolute value) at least to the third Zener voltage Vz3 plus twice the diode threshold voltage value Vf, the diode D5 is forward biased (and a voltage drop across it is essentially equal to the threshold voltage Vf) whereas the diode D6 is reverse biased and a voltage drop thereacross is essentially equal to the Zener voltage Vz3, In such case, a current flows through the first branch 210 from the cathode terminal of the diode D6 to the cathode terminal to the diode D5 (i.e., adopting the convention of the drawing, the first current I210 is negative). A portion of the first current I210 flows through the resistor R3 and develops there across, and thus between the emitter terminal and the base terminal of the transistor P4, a forward voltage (substantially equal to the threshold voltage Vf) adapted to turn on the transistor P4. In such a way, a third current I220 (negative, adopting the convention shown in the drawing) flows trough the third circuit branch 220 from the emitter terminal of the transistor P4 to the collector terminal of the transistor P3. The second circuit branch 215 is instead not conductive since the base-emitter voltage of the transistor P2 is negative (the transistor base-emitter junction is reversed biased). In this case, the discharge current Ibv is partitioned in the currents I210 and I220 and is safely sunk from the semiconductor device 110.

During the normal operation (i.e., when no ESD event occurs) the protection circuit 205 is disabled. In such case, the drive voltage Vin is lower than the breaking voltage Vbv so that the first circuit branch 210 is not conductive (since the voltage drop applied across it is not sufficient for causing Zener breakdown of either of the two Zener diodes D5 and D6). No current flows through the resistor R3, and thus so neither of the transistors P2 and P4 turns on: both the second and third branches 215 and 220 are as well off.

It should be noted that, compared to the conventional ESD protection circuit 105, the ESD protection circuit 205 according to the invention embodiment described reduces, in a non-negligible way (to a half), the number of the Zener diodes thereof, improving the speed of intervention of the ESD protection circuit 205. In other words, by using the transistors P1-P4 the second circuit branch 215 or the third branch 220 guarantees a protection from ESD events also in case the drive voltage Vin varies very fast.

Moreover, by using BJT transistors instead of Zener diodes, the semiconductor area occupation of the ESD protection circuit 205 can be reduced with respect to the case in which the Zener diodes D3 and D4 are used.

Also, leakage effects (such as leakage currents) are reduced, and thus the overall performance of the integrated circuit including the proposed ESD protection circuit 205 is improved. For example, in battery-operated electronic systems, the reduced leakage currents allow increasing the lifetime of the batteries.

Figure 3:
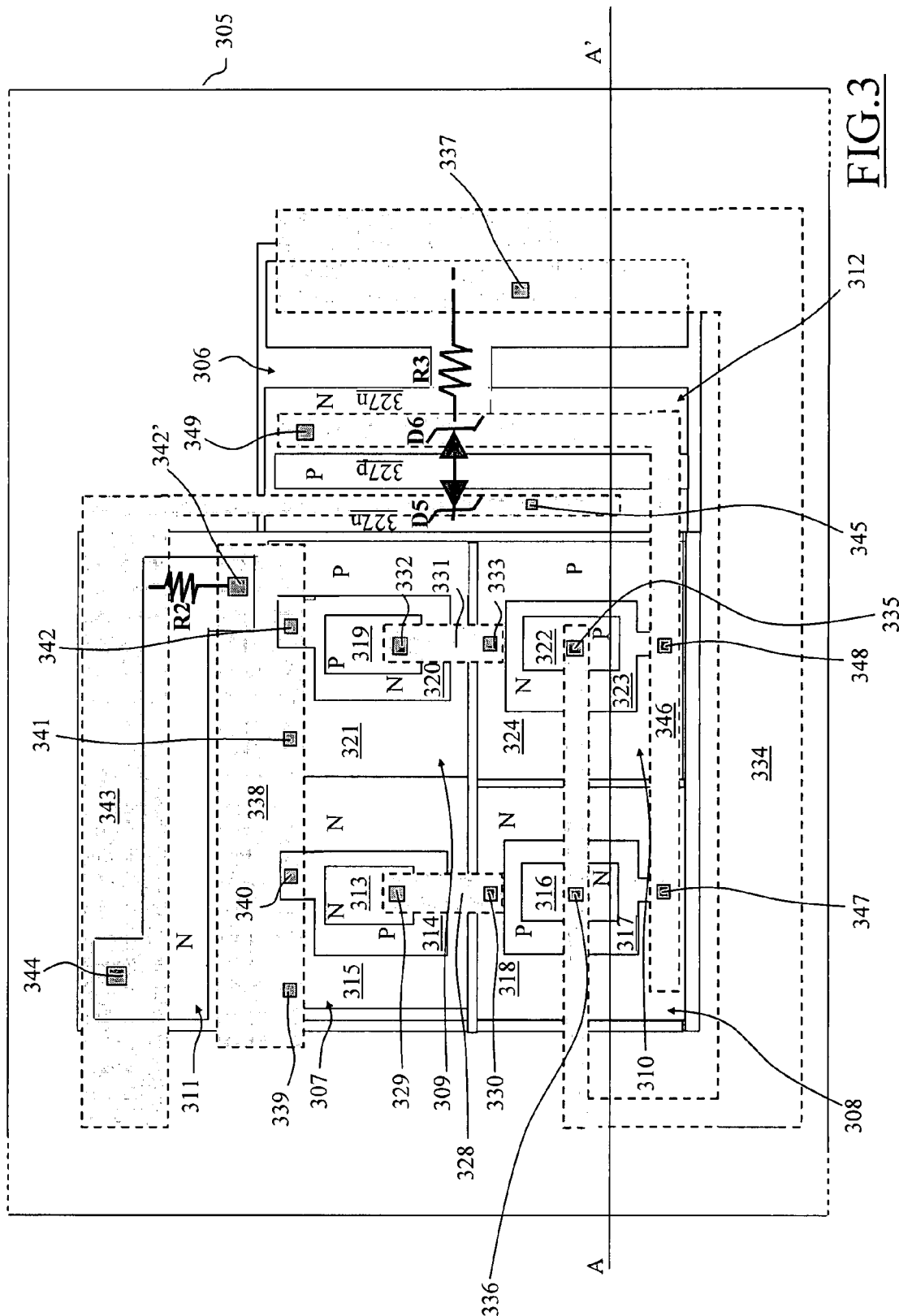
FIG. 3 schematically shows a top view of a layout of the ESD protection circuit of FIG. 2 according to an embodiment of the present invention.

Moving now to FIG. 3, a layout of the ESD protection circuit depicted in FIG. 2 according to an embodiment of the present invention is schematically shown. As usual, the concentrations of N-type and P-type impurities (or dopants) are denoted by adding the sign + or the sign − to the letters N and P to indicate a high or low concentration of impurities, respectively; the letters N and P without the addition of any sign + or − denote concentrations of intermediate value.

A common polycrystalline silicon (polysilicon) layer 305 is partitioned into multiple insulated regions by insulation trenches 306 (for example, of the Shallow Trench IsolatioN-type). Each one of the insulated regions is used to form one among the electronic components of the ESD protection circuit 205. In the example at issue, two insulated regions 307 and 308 are used to form the transistors P1 and P2, whereas two further insulated regions 309 and 310 are used to form the transistors P3 and P4.

An insulated region 311 is used to form the resistor R2 whereas a further insulated region 312 is used to form the Zener diodes D5 and D6 and the resistor R3.

In an embodiment of the present invention, the polysilicon layer 305 may be the same polysilicon layer used to form the gate electrode of the power MOSFET 110.

The insulated regions of polysilicon also include portions suitably doped with P-type or N-type.

In particular, the Zener diodes D5 and D6 are obtained by two PN junctions which are formed by doping with P-type impurities a region 327p of the insulated region 312, intended to form a common anode for the two diodes D5 and D6, between two regions 327n of the insulated region 312, doped with N-type impurities, arranged at both sides of the region 327p and intended to each form a cathode of a respective one of the diodes D5 and D6. The remaining portion of the insulated region 312 is used to form the resistor R3.

The region 307 includes an N-type region 313 intended to form the emitter of the transistor P1, surrounded by a P-type region 314 intended to form the base of transistor P1; the region 314 is in turn surrounded by an N-type region 315 intended to form the collector of transistor P1.

Similarly, the region 308 includes an N-type region 316 intended to form the emitter of the transistor P2, surrounded by a P-type region 317 intended to form the base of transistor P1, which is in turn surrounded by an N-type region 318 intended to form the collector of transistor P1.

The region 309 includes a P-type region 319 intended to form the emitter of transistor P3, surrounded by an N-type region 320 intended to form the base of transistor P3, which is in turn surrounded by a P-type region 321 intended to form the collector of transistor P3.

Similarly to the region 309, the region 310 includes a P-type region 322 intended to form the emitter of transistor P4, surrounded by an N-type region 323 intended to form the base of transistor P4, which is in turn surrounded by a P-type region 324 intended to form the collector of transistor P4.

The resistor R2 is obtained by N-type doping the insulated polysilicon region 311.

Metallization strips (shown in dashed lines), and contact regions, connect the electronic components of the ESD protection circuit 205.

In particular, a metal strip 328 connects the region 313 forming the emitter of the transistor P1 to the region 318 forming the collector of the transistor P2 through two contact regions 329 and 330 (which are in correspondence with the region 313 and the region 318, respectively).

A further metal strip 331 connects the region 324 forming the collector of the transistor P4 to the region 319 forming the emitter of the transistor P2, by means of two corresponding contact regions 332 and 333.

A metal strip 334 connects the region 322 forming the emitter of the transistor P4 to the region 316 forming the emitter of the transistor P2, through two corresponding contact regions 335 and 336. The metal 334 also forms the terminal 109 of the protection circuit 205, and is connected to the source metal of the power MOSFET 110. The metal strip 334 also contacts a portion of the insulated region 312, which is used to form the load resistor R3 through a contact region 337.

A metal strip 338 contacts the region 314 forming the base of the transistor P1 to the region 315 forming the collector of the same transistor, through two contact regions 339 and 340. Two further contact regions 341 and 342 are provided to connect the region 321 forming the collector of the transistor P3 to the region 320 forming the base of the same transistor. The metal strip 338 also connects a portion of the insulated region 311 (used for forming the first terminal of the resistor R2) with the region 321 forming the collector of the transistor P1 through a contact region 342'. The metal strip 338 also forms the IC terminal 106.

A further metal strip 343 is provided to connect the first terminal of the resistor R2 to the cathode terminal of the diode D5 through two contact regions, 344 and 345 which are in correspondence with the insulated region 311 and the region 327n, respectively.

Finally, a metal strip 346 connects the region 317 forming the base of the transistor P2 to the region 323 forming the base of the transistor P4 by two corresponding contact regions 347 and 348. The metal strip 346 is also connected to the cathode of the diode D6 by a contact region 349.

Moving now to FIGS. 4A through 4F, cross-sectional views along a line AA' of FIG. 3 are shown, illustrating schematically the main phases of a manufacturing process of the transistor P2 according to an embodiment of the present invention are shown. Similar considerations apply for the other transistors of the protection circuit 205.

Figure 4A:
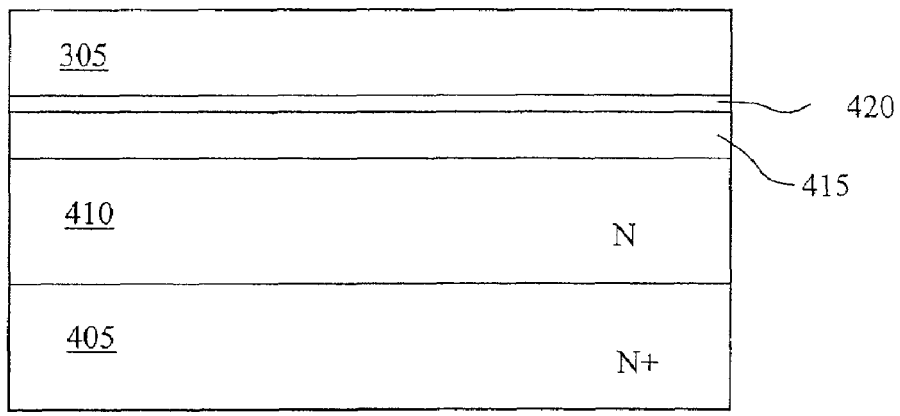
FIGS. 4A through 4F are cross-sectional views illustrating schematically the main phases of a manufacturing process of a transistor belonging to the ESD protection circuit of FIG. 2, according to an embodiment of the present invention.

Considering in particular FIG. 4A, the starting material is a silicon substrate 405. For example, the substrate 405 is of the N-type of conductivity with a dopant concentration typically ranging from approximately $1*10^{18}$ ions/cm$^3$ to $1*10^{19}$ ions/cm$^3$.

Thereafter, an epitaxial growth is carried out (for example, by means of Vapor-Phase Epitaxy), to form an epitaxial layer 410 with a dopant concentration for example ranging from approximately $1*10^{13}$ ions/cm$^3$ to approximately $1*10^{16}$ ions/cm$^3$ and a thickness ranging from 0.5 μm to 200 μm. For example, in the case of a power MOSFET, the epitaxial layer 410 forms the drift layer.

An oxide layer 415 with a typical thickness ranging from 200 nm to 1500 nm is then formed, for example by thermal growth, on selected portions of the top of the layer 410. Then, a relatively thin oxide layer 420 is formed (for example, by thermal growth or by deposition) on top of the buried oxide layer 410. The oxide layer 420 will form the gate of the power MOSFET.

Then, the polycrystalline silicon layer 305 is formed, for example by means of a Low-Pressure Chemical Vapor Deposition method. In the example at issue, the layer 305 has a thickness approximately ranging from 150 nm to 1000 nm.

Such polycrystalline silicon layer 305 can be used as a conductive layer (e.g., forming resistors), or as a P-type or N-type semiconductor layer, by properly doping it with different impurities (or dopant ions). In an embodiment of the present invention, the polycrystalline silicon layer 305 forms the gate electrode of the power MOSFET 110.

Figure 4B:
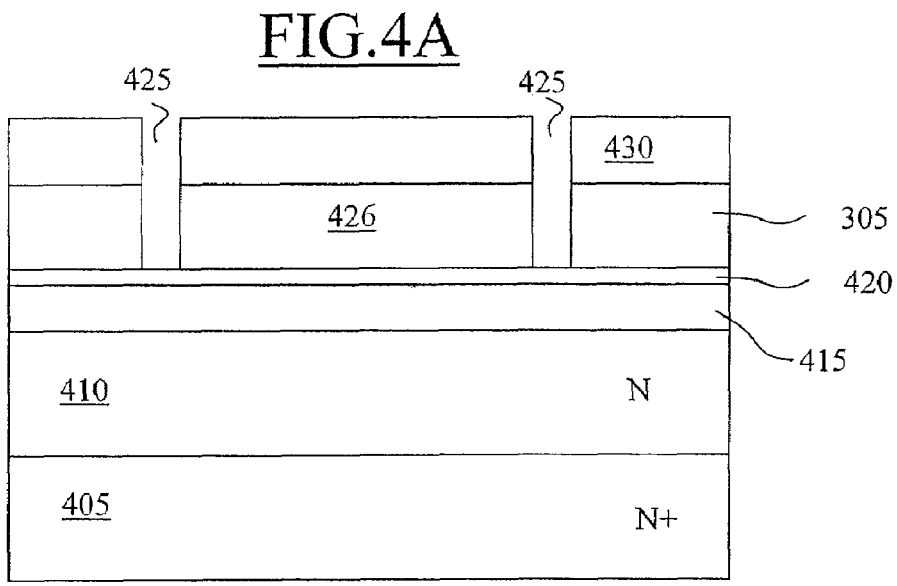

Moving to FIG. 4B, recesses 425 are formed, by selectively etching the polycrystalline silicon layer 305. In order to form the recesses 425, a photoresist mask 430 is provided on top of the polycrystalline silicon layer 305, so as to leave exposed areas thereof where the recesses 425 are to be formed. In such a way, an active region 426 of the polycrystalline silicon layer 305 is protected from the etching that forms the recesses 425. Using suitable etching techniques (such as, dry etching process) the layer 305 is selectively removed, down to the gate oxide 420.

Figure 4C:
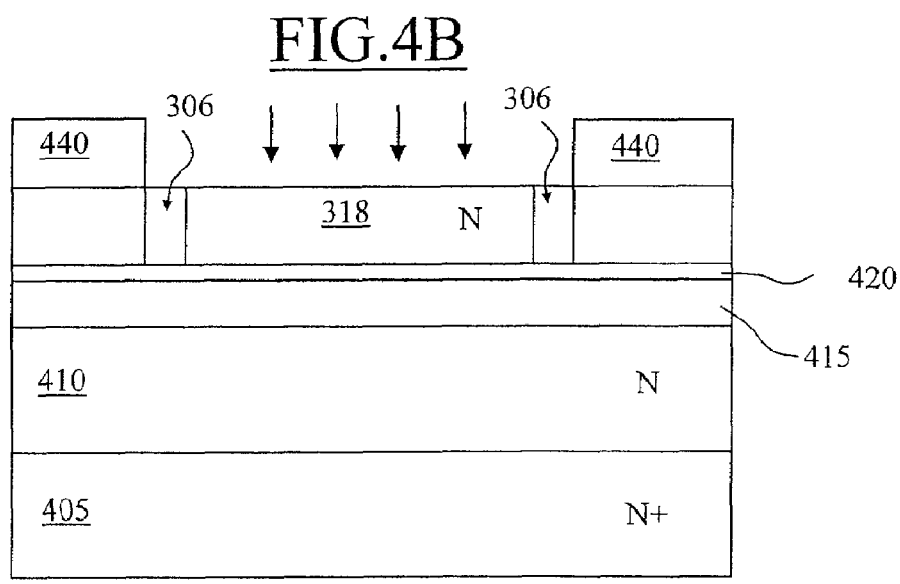

As shown in FIG. 4C, the mask 430 is then stripped and each recess 425 is filled with dielectric material, such as silicon dioxide, thus forming the STI trenches 306. More in detail, such filling of dielectric material is achieved by an oxidation process (such as, CVD oxide deposition).

A first dopant implantation is performed in order to dope the active polysilicon region 426, thus forming the region 318 that will form the collector of the transistor P2. Such implantation may use a dedicated mask 440 so as to leave exposed areas of the polycrystalline layer 305 where the dopant ions are to be implanted, or, alternatively, one of the masks used for the manufacturing of the power MOSFET (e.g., that used for forming the source regions thereof) may be used.

The first implantation process is performed at a relatively high energy, ranging from 30 to 200 KeV, in order to cause the dopant ions to penetrate within the active region 426. For example, in order to form the collector region 318, phosphorous dopant ions may be used; preferably, the dopant dose ranges from $2*10^{15}$ ions/cm$^2$ to $7*10^{15}$ ions/cm$^2$.

Preferably, the dopant ions, after having been implanted, are activated by means of a low thermal budget Rapid Thermal Process (RTP).

Figure 4D:
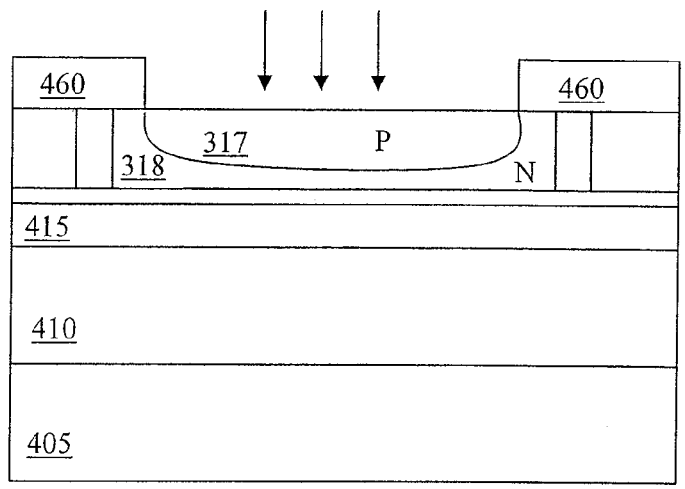

As shown in FIG. 4D, the mask 440 is stripped and a second dopant implantation process is performed, in order to form the region 317 which will form the base of the transistor P2. For this purpose, a further mask 460 is provided on top of the exposed surface of the polycrystalline silicon layer 305, so as to leave uncovered areas thereof where the region 317 has to be formed. In the example at issue, boron dopant ions may be used; preferably, the dopant dose ranges from $1*10^{13}$ ions/cm$^2$ to $5*10^{14}$ ions/cm$^2$.

Moreover, such second implantation process is performed at a relatively high energy, ranging from 30 to 200 KeV.

In this case as well, the dopant ions, after having been implanted, are activated by means of a low thermal budget Rapid Thermal Process (RTP).

Alternatively, the region 317 can be formed during the manufacturing of a body region of the power MOSFET. In such case, a common mask leaves exposed areas of the polycrystalline silicon layer 305 where the base region 317 of the transistor P2 is desired and the areas (not shown in figure) of the epitaxial layer 410 where the body region of the MOSFET is desired.

Figure 4E:
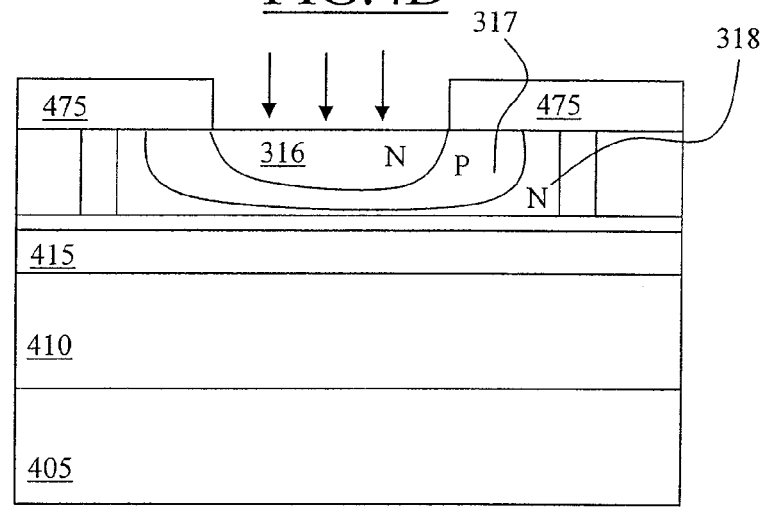

Referring now to FIG. 4E, the mask 460 is stripped and a third dopant implantation process is performed in order to form the region 316 which will form the emitter of transistor P2. For this purpose, a further mask 475 is provided on top of the exposed surface of the active region 426 and the STI trenches 306, so as to leave uncovered areas thereof where the (emitter) region 316 is desired. In the example at issue, phosphorus dopant ions may be used; preferably, the dopant dose ranges from $2*10^{15}$ ions/cm$^2$ to $7*10^{15}$ ions/cm$^2$.

Preferably, such second implantation process is performed at a relatively high energy, ranging from 30 to 200 KeV.

Alternatively, the emitter region 316 can be formed during the manufacturing of a source region of the power MOSFET. In such case, a further common mask leaves exposed areas of the polycrystalline silicon layer 305 where the emitter region 316 of the transistor P2 is desired and the areas (not shown in the figure) of the epitaxial layer 410 where the source region of the MOSFET is desired.

Figure 4F:
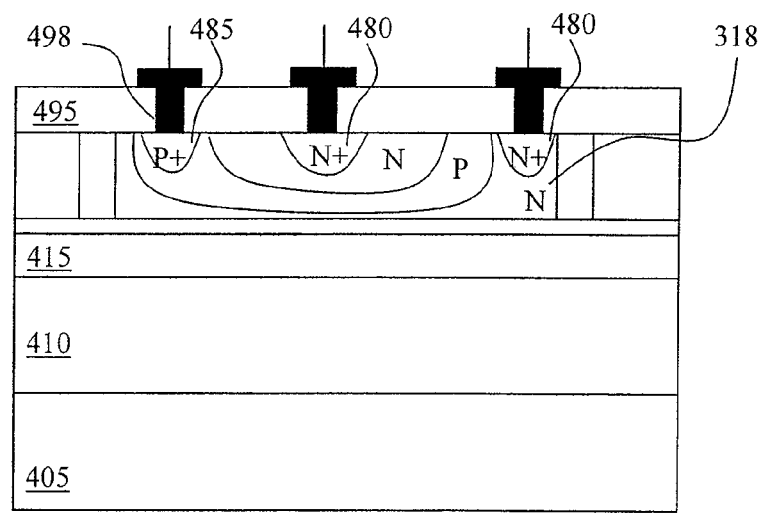

As shown in FIG. 4F, heavily doped N-type regions 480 and a heavily doped P-type region 485 are then formed for the subsequent realization of the ohmic contacts of the collector, emitter and base regions of the transistor P2.

Thereafter, a dielectric layer 495 is formed and contact windows 498 are etched through the oxide layers 495 down to the surface of the regions 316, 317 and 318.

Afterwards, a metallization layer (e.g. aluminum) is deposited on the dielectric layer 495, and metallization trips connect the transistor P2 to the remaining components.

The transistor P1 can be formed in a way totally similar. The transistors P3 and P4 are obtained by a manufacturing process having processing phases similar to the above-described ones, but with dopants of the opposite type. For example, in order to form the N-type base region 320 and 323 of the transistors P3 and P4 of the PNP-type, phosphorous dopant ions can be used with a dopant dose ranging from $1*10^{13}$ ions/cm$^2$ to $5*10^{14}$ ions/cm$^2$ whereas the collector and emitter regions 319, 321, 322 and 324 boron dopant ions can be used with a dopant dose ranging from $2*10^{15}$ ions/cm$^2$ to $7*10^{15}$ ions/cm$^2$.

Figure 5A:
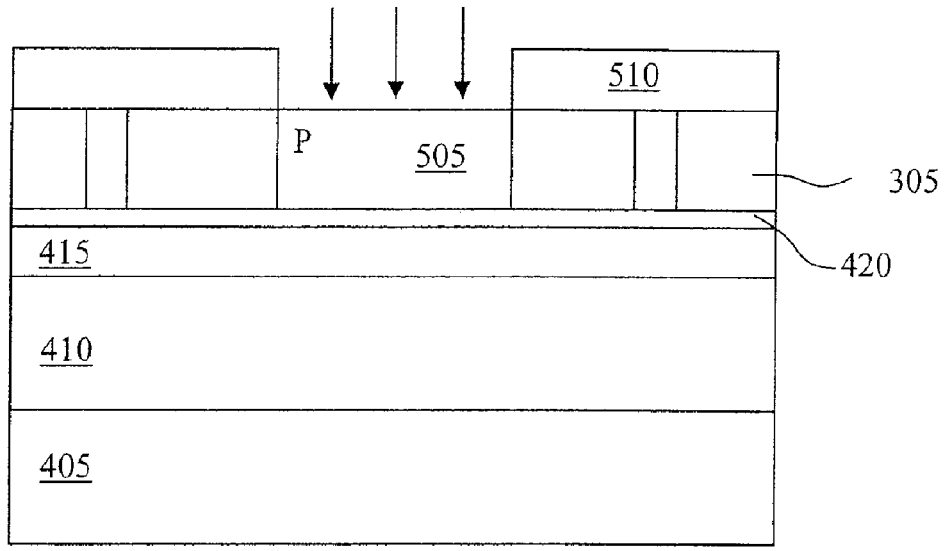
FIGS. 5A through 5C are schematic cross-sectional views that show a sequence of phases of a manufacturing process of a transistor belonging to the ESD protection circuit of FIG. 2, according to a further embodiment of the present invention.
Figure 5B:
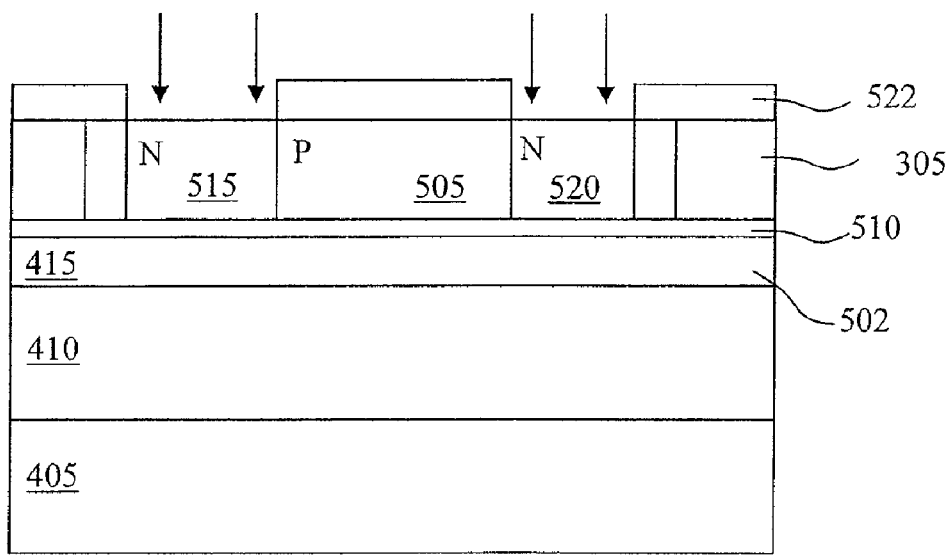
Figure 5C:
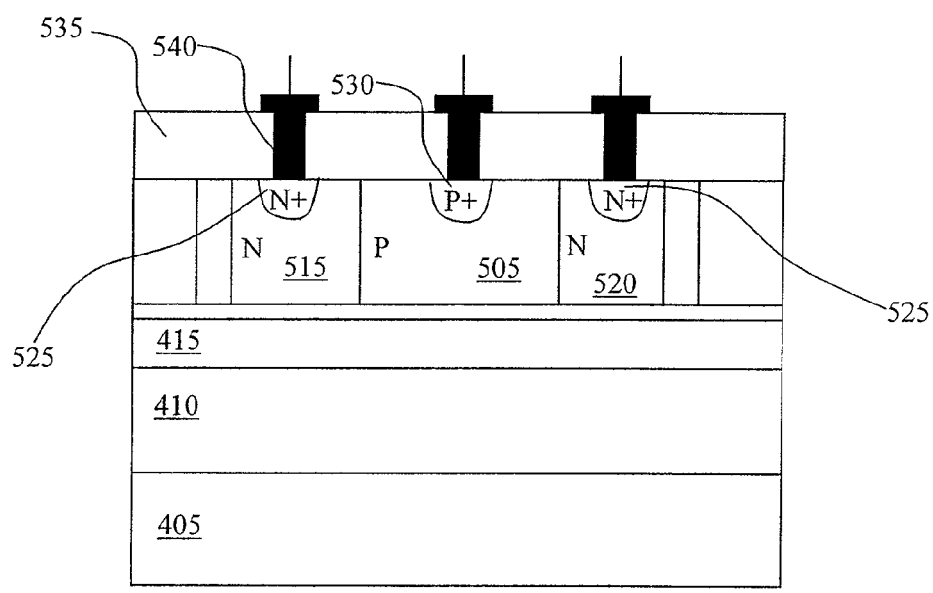

Referring now to FIGS. 5A through 5C, an alternative way of realizing the transistor P2 according to a second embodiment of the present invention is described (although transistor P2 is considered, similar considerations apply as well to the other transistors P1, P3 and P4 of the protection circuit 205). In particular, differently from the sequence of phases of the manufacturing process previously described, the first, second and third implantation processes (for forming the emitter, collector and base regions of the transistor P2) are respectively replaced by with the following process phases, shown in FIGS. 5A-5C.

As shown in FIG. 5A, after the deposition of the polycrystalline silicon layer 305, a first dopant implantation process is performed in order to form within the polycrystalline silicon layer 305 a P-type region 505 that will form the base region of the transistor P2. Such implantation may use a dedicated mask 510 so as to leave exposed areas of the polycrystalline silicon layer 305 where the dopant ions to be implanted.

Particularly, the first implantation process is performed at a relatively high energy, ranging from 30 to 200 KeV, in order to cause the dopant ions penetrate within the polycrystalline silicon layer 305. For example, boron dopant ions may be used; preferably, the dopant dose ranges from $1*10^{13}$ ions/cm$^2$ to $5*10^{14}$ ions/cm$^2$.

Preferably, the dopant ions, after having been implanted, are activated by means of a low thermal budget Rapid Thermal Process (RTP).

Moving now to FIG. 5B, the mask 510 is stripped and a second dopant implantation process is performed in order to form two N-type regions 515 and 520, which will form the emitter and collector regions of the transistor P2, respectively. For this purpose, a further mask 522 is provided on top of the exposed surface of the polycrystalline silicon layer 305, so as to leave uncovered areas thereof where the regions 515 and 520 have to be formed. In the example at issue, phosphorous dopant ions may be used; preferably, the dopant dose ranges from $2*10^{15}$ ions/cm$^2$ to $7*10^{15}$ ions/cm$^2$.

Moreover, such second implantation process is performed at a relatively high energy, ranging from 30 to 200 KeV.

In this case as well, the dopant ions, after having been implanted, are simply activated by means of a low thermal budget Rapid Thermal Process (RTP).

From now on, the manufacturing process proceeds in the way described in connection with the first embodiment that brings to the finished transistor P2.

In particular, as shown in FIG. 5C, N-type heavily doped regions 525 and a heavily doped P-type region 530 are then formed for the subsequent realization of the ohmic contact to the collector, emitter and base regions of the transistor P2.

Thereafter, a dielectric layer 535 is formed and contact windows 540 are etched through the dielectric layer 535 down to the surface of the regions 525 and 530.

Afterwards, a metallization layer (e.g. aluminum) is deposited on the dielectric layer 535, and metallization strips connect the transistor P2 to the remaining components.

In this case as well, the transistor P1 can be formed in a way totally similar. The transistors P3 and P4 may be obtained by a manufacturing process having processing phases similar to the above-described ones, but with dopants of the opposite type.

As can be noted, by the manufacturing processes just described, it is possible to manufacture the ESD protection circuit 205 within a polycrystalline silicon layer, which expediently may be the same polysilicon layer used to form further semiconductor devices (such as the gate electrode of the power MOSFET).

Moreover, the ESD protection circuit according to the described embodiment guarantees a significantly high protection from ESD event of the semiconductor device 110 even if BJTs having a unit current gain are used (the integration of BJTs transistors having significantly high current gains would be more complicated).

Naturally, in order to satisfy local and specific requirements, a person skilled in the art may apply to the solution described above many modifications and alterations. Particularly, although the present invention has been described with a certain degree of particularity with reference to preferred embodiments thereof, it should be understood that various omissions, substitutions and changes in the form and details as well as other embodiments are possible; moreover, it is expressly intended that specific elements and/or method steps described in connection with any disclosed embodiment of the invention may be incorporated in any other embodiment as a general matter of design choice.

For example, similar considerations apply if the transistors have an equivalent structure (such as with layers having different thickness); moreover, although in the preceding description reference has been made to a semiconductor substrate and an epitaxial layer of N-type, the conductivity type of these layers may be reversed (i.e., of P-type).

It is emphasized that the described manufacturing process is not to be interpreted in a limitative manner; particularly, it is possible to use equivalent steps, to remove some steps being not essential, or to add further optional steps. For example, a further dopant implantation process (for example, using a dopant dose ranging from $1*10^{12}$ ions/cm$^2$ to $5*10^{14}$ ions/cm$^2$) can be performed—at a relatively high energy, for example ranging from 30 to 200 KeV—in order to form a lightly doped region within the substrate layer and having a type of conductivity opposite to one of the substrate layer. Such lightly doped region is adapted for making the final structure more robust during the changing of polarity of the drive voltage Vin and thus for shielding the polycrystalline silicon region wherein the ESD protection circuit is formed from undesired breakdown voltage events.

In any case, different dopant ions can be used during the implantation process.

Alternative layouts are also feasible (for example, with different sides and/shapes of the collector, emitter and base region of each transistor, or other arrangements thereof).

In any case, the solution of the invention is also suitable to be implemented by using other types of transistors, such as JFETs and MOSFETs (acronym for Junction Field Effect Transistor).

Moreover, although in the preceding description reference has been made to BJTs having a current gain between the base current flowing through its base terminal and the emitter current flowing through its emitter terminal approximately equal to one it is possible to use BJTs having current gains higher or lower than the unit value.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. An electro-static discharge protection circuit comprising:
    a first input terminal and a second input terminal;
    a first output terminal coupled to the first input terminal, and a second output terminal coupled to the second input terminal;
    a first circuit branch connected between the first input terminal and the second input terminal, said first circuit branch including at least one first Zener diode having a cathode terminal and an anode terminal; and
    a second circuit branch connected between the first output terminal and the second output terminal,
    wherein the first circuit branch comprises a load element coupled in series between the second input terminal and the at least one first Zener diode and wherein the second circuit branch includes a first transistor having a control terminal adapted to receive a transistor control voltage, the first transistor being coupled to the load element so as to receive from the load element the transistor control voltage, and
    wherein the second circuit branch includes a second transistor, said second transistor being connected in diode-configuration in series to the first transistor.

2. The electro-static discharge protection circuit according to claim 1, wherein the first transistor has the control terminal coupled to the load element, a first terminal of the first transistor coupled to the second output terminal and a second terminal of the first transistor coupled to the first output terminal.

3. The electro-static discharge protection circuit according to claim 1, wherein the first circuit branch includes at least one second Zener diode having a cathode terminal and an anode terminal, wherein the first Zener diode has the cathode terminal connected to the first input terminal and the anode terminal connected to the anode terminal of the second Zener diode, the second Zener diode having the cathode terminal connected to a first terminal of the load element, a second terminal of the load element being connected to the second output terminal.

4. The electro-static discharge protection circuit according to claim 3, further comprising a third circuit branch connected between the first output terminal and the second output terminal, said third circuit branch including at least one third transistor, the third transistor having a control terminal coupled to the load element, a first terminal of the third transistor coupled to the second output terminal and a second terminal of the third transistor coupled to the first output terminal, said third transistor being activated by a transistor control voltage opposite compared to the transistor control voltage adapted to activate the first transistor.

5. The electro-static discharge protection circuit according to claim 4, wherein the third circuit branch includes a fourth transistor, said fourth transistor being connected in diode-configuration in series to the third transistor.

6. The electro-static discharge protection circuit according to claim 5, wherein said first transistor and said second transistor are bipolar junction transistors having a first type of polarity and said third transistor and fourth transistor are bipolar junction transistor having a second type of polarity, the first type of polarity being opposite of the second type of polarity.

7. The electro-static discharge protection circuit according to claim 1, wherein said load element comprises a resistor.

8. The electro-static discharge protection circuit according to claim 1, wherein the first output terminal is connected to the first input terminal by a second resistor, the second resistor having a first terminal which is connected to the first input terminal and a second terminal which is connected to the first output terminal.

9. The electro-static discharge protection circuit according to claim 1, wherein the first transistor and the load element are formed in at least one polycrystalline silicon layer.

10. A device, comprising:
a first terminal configured to receive an input voltage;
a first branch coupled to the first terminal and a second terminal, the first branch comprising:
  a first diode operable in forward bias and reverse bias modes; and
  a load element connected in series to the at least one diode; and
a second branch comprising at least one transistor being controlled by a load voltage across the load element and a diode-configured transistor connected in series to the at least one transistor, wherein the first branch further comprises a second diode operable in forward bias and reverse bias modes, an anode of the second diode being coupled to an anode of the first diode, the cathode of the second diode being coupled to the load element.

11. The device of claim 10, wherein the second terminal is coupled to the load element and the second branch.

12. The device of claim 10, wherein a resistance of the first diode and the second diode is less than 100 ohms.

13. The device of claim 10, wherein the at least one transistor of the second branch has a first polarity.

14. The device of claim 10, wherein the at least one transistor comprise a bipolar junction transistor.

15. The device of claim 10, further comprising at least one semiconductor element.

16. The device of claim 10, further comprising a third branch, the third branch comprising a third diode-connected transistor, an emitter node of the third diode-connected transistor being coupled to a collector node of a fourth transistor.

17. The device of claim 16, wherein the at least one transistor of the second branch has a first polarity and wherein the third diode-connected transistor and the fourth transistor have a second polarity.

18. The device of claim 16, wherein a base node of the fourth transistor is coupled to the load element.

19. The device of claim 15, wherein the first branch or the second branch provide electrostatic discharge protection for the at least one semiconductor element.

20. The device of claim 15, wherein an absolute value of a breakdown voltage of the first diode and the second diode is lower than an absolute value of a breakdown voltage of the at least one semiconductor device.

21. The device of claim 16, wherein the second branch is activated and the third branch is inactive when the input voltage at the first terminal exceeds a determined voltage.

22. The device of claim 16, wherein the third branch is activated and the second branch is inactive when a voltage at the second terminal exceeds a determined voltage.

* * * * *